(12) United States Patent
Kim et al.

(10) Patent No.: US 10,546,539 B2
(45) Date of Patent: Jan. 28, 2020

(54) ORGANIC LIGHT EMITTING DIODE DISPLAY DEVICE

(71) Applicant: LG Display Co., Ltd., Seoul (KR)

(72) Inventors: Kyung-Min Kim, Seoul (KR); In-Hyo Han, Seoul (KR); Seok Noh, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/116,551

(22) Filed: Aug. 29, 2018

(65) Prior Publication Data

US 2019/0066599 A1  Feb. 28, 2019

(30) Foreign Application Priority Data

Aug. 20, 2017 (KR) .................. 10-2017-0109828

(51) Int. Cl.
  *G09G 3/30* (2006.01)
  *G09G 3/3266* (2016.01)
  *G09G 3/3291* (2016.01)
  *H01L 27/32* (2006.01)

(52) U.S. Cl.
  CPC ......... *G09G 3/3266* (2013.01); *G09G 3/3291* (2013.01); *H01L 27/3258* (2013.01); *G09G 2300/0439* (2013.01); *G09G 2310/08* (2013.01); *H01L 27/3276* (2013.01)

(58) Field of Classification Search
  CPC ..... G09G 2300/023; G09G 2300/0408; G09G 2300/0426; G09G 2300/0452; G09G 2310/0251; G09G 2310/0281; G09G 2310/0286; G09G 2310/08; G09G 2330/021; G09G 2330/04; G09G 2330/06; G09G 2380/02; G09G 3/20; G09G 3/3225; G09G 3/3233; G09G 3/3266; G09G 3/3275; H01L 27/0248; H01L 27/1214; H01L 27/3213; H01L 27/3262; H01L 27/3276; H01L 51/5237
  See application file for complete search history.

(56) References Cited

U.S. PATENT DOCUMENTS

2015/0340003 A1* 11/2015 Choi .................. G09G 3/3696
  345/92
2017/0178559 A1* 6/2017 Kim .................... G09G 3/20

* cited by examiner

*Primary Examiner* — Insa Sadio
(74) *Attorney, Agent, or Firm* — Polsinelli PC

(57) ABSTRACT

Disclosed herein is an organic light emitting diode (OLED) display device including an OLED display panel including a non-active area and an active area, having a plurality of gate lines and a plurality of data lines disposed in the active area, and having a plurality of subpixels arranged at intersections between the gate lines and the data lines in a matrix, a gate driver disposed in the non-active area of the OLED display panel to supply a scan pulse to the plurality of gate lines, and a bootstrap capacitor for preventing output loss of the scan pulses of the gate driver in the active area of the OLED display panel.

16 Claims, 7 Drawing Sheets

FIG. 9

| Division | 13.3"(166ppi) | | 55"UHD (80ppi) | |
|---|---|---|---|---|
| | Conventional | Invention | Conventional | Invention |
| Bootstrap Cap. (fF) | 4,000 | 4,115 | 5,000 | 5,136 |
| S/D wiring width (μm) | 5 | ← | 6.5 | ← |
| Horizontal length of Cap. (mm) | 0.85 | 10.74 | 0.52 | 11.34 |
| Area occupied by Cap in bezel (mm) | 0.85 | 0 | 0.52 | 0 |
| Bezel size (mm) | 7.2 | 6.3 | 5.5 | 4.9 |
| Note | - | PXL~70ea | - | PXL~36ea |

ORGANIC LIGHT EMITTING DIODE DISPLAY DEVICE

CROSS REFERENCE TO RELATED APPLICATION

This application claims the benefit of Korean Patent Application No. 10-2017-0109828, filed on Aug. 30, 2017, which is hereby incorporated by reference in its entirety as if fully set forth herein.

BACKGROUND

Field of the Disclosure

The present disclosure relates to an organic light emitting diode (OLED) display device and, more particularly, to an OLED display device in which a bootstrap capacitor of a gate-in-panel (GIP) is disposed in an active area.

Description of the Background

With the development of an information-oriented society and the development of various portable electronic apparatuses such as mobile communication terminals and laptops, demand for flat panel display devices has gradually increased.

As a flat panel display device, a liquid crystal display (LCD) device using liquid crystal and an organic light emitting diode (OLED) display device using an OLED are used.

Such a flat panel display device includes a display panel including a plurality of gate lines and a plurality of data lines to display an image, and a driver for driving the display panel.

The driver includes a gate driver for driving the plurality of gate lines, a data driver for driving the plurality of data lines, and a timing controller for supplying image data and various control signals to the gate driver and the data driver.

The gate driver may be simultaneously formed in a non-active area of the display panel during the process of forming the plurality of gate lines and the plurality of data lines of the display panel and pixels.

That is, a gate-in-panel (hereinafter referred to as "GIP") method of integrating the gate driver on the display panel can be applied.

The gate driver includes a plurality of stages (GIPs) in order to sequentially supply scan pulses to the plurality of gate lines.

However, when the plurality of GIPs corresponds one-to-one to the plurality of gate lines, recent designs requiring both a high resolution and a narrow bezel cannot be satisfied.

Accordingly, recently, one carry pulse output unit and at least two scan pulse output unit are provided such that one GIP drives at least two gate lines.

FIG. 1 is a block diagram showing the configuration of a general GIP.

As shown in FIG. 1, the GIP includes a node controller 100 which is set by a carry pulse SET output from a previous-stage GIP and is reset by a carry pulse RST output from a next-stage GIP to control voltages of the first and second nodes Q and Qb and an output unit 200 for receiving two of a plurality of scan pulse output clock signals SCCLKs and one of a plurality of carry pulse output clock signals CRCLKs and outputting two scan pulses Vgout(n) and Vgout(n+1) and one carry pulse COUT(n) according to the voltage levels of the first and second nodes Q and Qb.

For the general GIP, output loss can occur in the two scan pulses Vgout(n) and Vgout(n+1) output from the output unit 200, and there is ripple at the first node Q.

SUMMARY

Accordingly, the present disclosure is directed to an OLED display device that substantially obviates one or more problems due to limitations and disadvantages of the conventional art.

In addition, the present disclosure is to provide an OLED flat panel display device capable of prevent output loss and ripple of the first node Q, by disposing a bootstrap capacitor in a scan pulse output unit of a GIP.

Further, the present disclosure is to provide an OLED flat panel display device capable of implementing a narrow bezel, by disposing a bootstrap capacitor included in a scan pulse output unit of a GIP in an active area.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, an organic light emitting diode (OLED) display device includes an OLED display panel including a non-active area and an active area, the OLED display panel having a plurality of gate lines and a plurality of data lines disposed in the active area, and having a plurality of subpixels arranged at intersections between the gate lines and the data lines in a matrix, a gate driver disposed in the non-active area of the OLED display panel to supply a scan pulse to the plurality of gate lines, wherein the gate driver includes a plurality of gate-in-panels (GIPs) connected in cascade and each GIP includes one carry pulse output unit and at least one scan pulse output unit for outputting the scan pulse to at least one of the plurality of the gate lines of the OLED display panel according to voltages of a first node and a second node of the GIP, and wherein a bootstrap capacitor of the scan pulse output unit is formed in the active area of the OLED display panel by overlapping the gate line and the first node laminated on the gate line.

The at least one scan pulse output unit may include an output terminal electrically connected to the at least one of the plurality of gate lines in order to supply the scan pulse to the gate line of the OLED display panel, and the first node may extend to the output terminal.

The each GIP further includes a clock signal reception unit for receiving clock signals from a timing controller, and a node controller for controlling the voltages of the first node and a second node of the GIP. The clock signal reception unit, the at least one scan pulse output unit and the node controller may be sequentially disposed from the outside to the active area of the OLED display panel, the at least one scan pulse output unit may include an output terminal electrically connected to the gate line in order to supply the scan pulse to the gate line of the OLED display panel, and the first node may extend to the output terminal.

The OLED display panel may further include a plurality of constant voltage supply lines and reference voltage supply lines arranged in parallel to the plurality of data lines, a buffer layer formed on an entire surface of the substrate including the data lines and the plurality of constant voltage supply lines and reference voltage supply lines, and an interlayer insulating film formed on an entire surface of the buffer layer including the plurality of gate lines, wherein the plurality of gate lines are formed on the buffer layer in a direction perpendicular to the data lines, and the first node is formed on the interlayer insulating film to overlap the gate lines.

The plurality of data lines and the plurality of constant voltage supply lines and reference voltage supply lines may be formed of the same material as a light shielding layer of the OLED display device, and the first node may be formed of the same material as a source/drain electrode of a switching TFT of the OLED display panel.

The number of the scan pulses output from the GIP may be $2^N$, wherein N is a natural number.

The bootstrap capacitor may be formed to extend to the output terminal of the at least one scan pulse output unit formed long inside the GIP.

Further, the present disclosure proposes an organic light emitting diode (OLED) display device, which includes an OLED display panel including a non-active area and an active area, having a plurality of gate lines and a plurality of data lines disposed in the active area, and having a plurality of pixels arranged at intersections between the gate lines and the data lines in a matrix; a gate driver disposed in the non-active area of the OLED display panel to supply a scan pulse to the plurality of gate lines; and a bootstrap capacitor that may be connected between the gate electrode and source electrode of a pull-up transistor of the at least one scan pulse output unit of the gate driver.

Each pixel may include an OLED and a pixel circuit for independently driving the OLED.

The pixel circuit may be configured to have one of 2T1C structure, 3T1C structure, 4T1C structure and 4T2C structure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the present disclosure and together with the description serve to explain the principle of the present disclosure.

In the drawings:

FIG. 9 is a table showing comparison in bezel size between a conventional OLED display device and an OLED display device according to the present disclosure.

DETAILED DESCRIPTION

The OLED display device according to the present disclosure having the above-described features will be described in greater detail with reference to the accompanying drawings.

Figure 2:
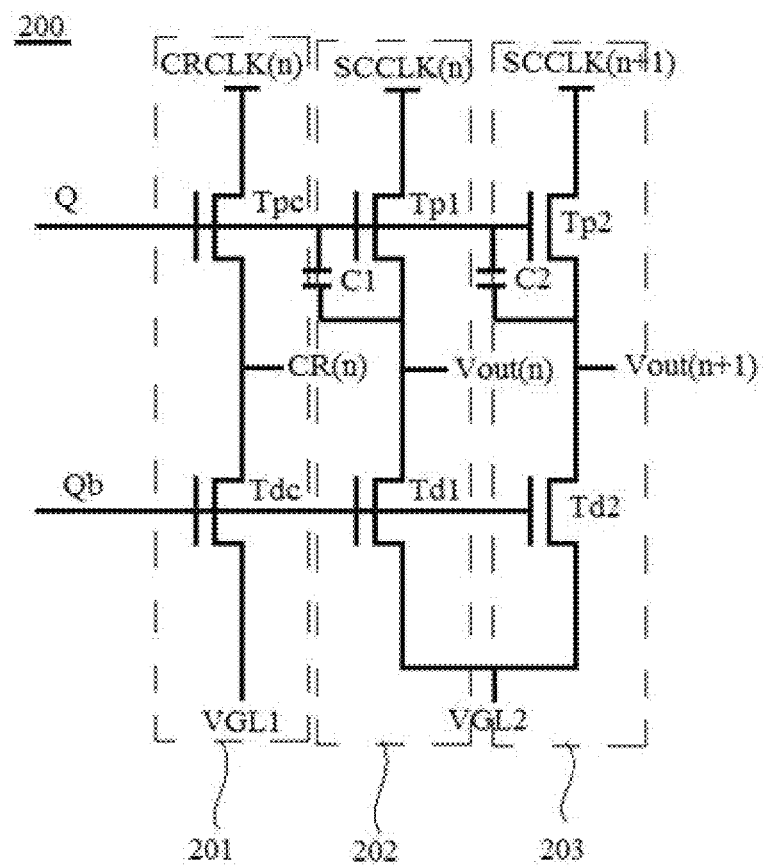
FIG. 2 is a circuit diagram of the output unit of FIG. 1.

FIG. 2 is a circuit diagram showing the output unit of a GIP of an OLED display device according to the present disclosure.

The output unit 200 of the GIP includes a carry pulse output unit 201, a first scan pulse output unit 202 and a second scan pulse output unit 203, as shown in FIG. 2.

The carry pulse output unit 201 includes a first pull-up transistor Tpc and a first pull-down transistor Tdc connected in series between a carry pulse output clock signal end CRCLK(n) for receiving one of a plurality of carry pulse output clock signals CRCLKs and a first gate low voltage end $VGL_1$. The first pull-up transistor Tpc is turned on/off in accordance with the voltage level of the first node Q and the first pull-down transistor Tdc is turned on/off according to the voltage level of the second node Qb, thereby outputting the received carry pulse output clock signal as a carry pulse CR(n).

The first scan pulse output unit 202 includes a second pull-up transistor Tp1 and a second pull-down transistor Td1 connected in series between a scan pulse output clock signal end SCCLK(n) for receiving one of a plurality of scan pulse output clock signals SCCLKs and a second gate low voltage end VGL2, and a first bootstrap capacitor C1 connected between a gate electrode and a source electrode of the second pull-up transistor Tp1. The second pull-up transistor Tp1 is turned on/off in accordance with the voltage level of the first node Q and the second pull-down transistor Td1 is turned on/off in accordance with the voltage level of the second node Qb, thereby outputting the received scan pulse output clock signal as a first scan pulse (Vout(n)).

The second scan pulse output unit 203 includes a third pull-up transistor Tp2 and a third pull-down transistor Td2 connected in series between the scan pulse output clock signal end SCCLK(n+1) for receiving another of the plurality of scan pulse output clock signals SCCLKs and the second gate low voltage end VGL2 and a second bootstrap capacitor C2 connected between a gate electrode and a source electrode of the third pull-up transistor Tp2. The third pull-up transistor Tp2 is turned on/off in accordance with the voltage level of the first node Q and the third pull-down transistor Td2 is turned on/off in accordance with the voltage level of the second node Qb, thereby outputting the received scan pulse output clock signal as a second scan pulse (Vout(n+1)).

The first and second scan pulse output units 202 and 203 respectively include first and second bootstrap capacitors C1 and C2 in order to prevent output loss. In addition, in order to prevent ripple of the first node Q, the first and second bootstrap capacitors C1 and C2 need to have sufficient charging capacity. Accordingly, since the area occupied by the first and second bootstrap capacitors C1 and C2 in the GIP is large, a bezel size is inevitably increased.

Figure 3:
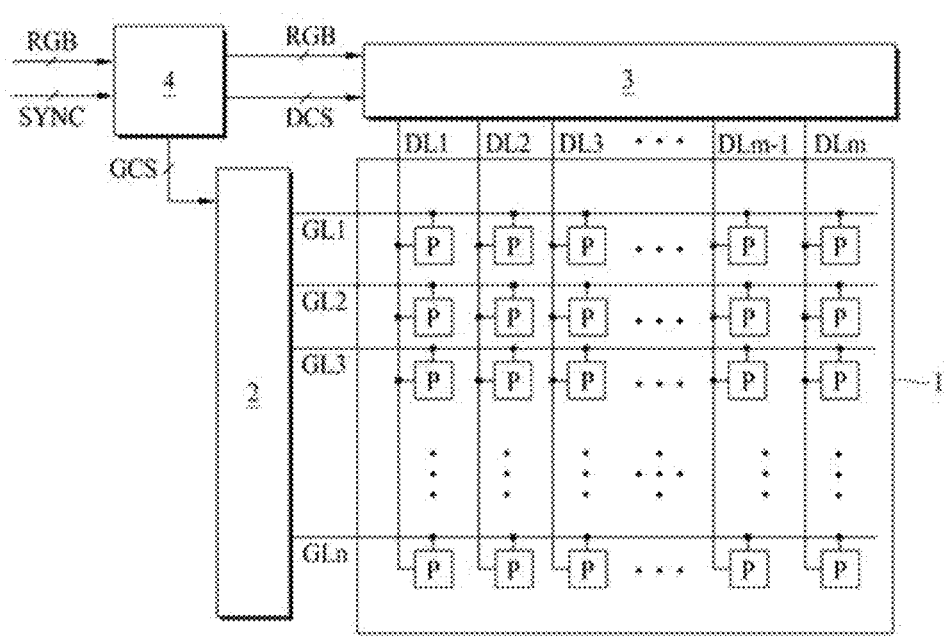
FIG. 3 is a diagram schematically showing an OLED display device according to the present disclosure.

FIG. 3 is a diagram schematically showing an OLED display device according to the present disclosure.

As shown in FIG. 3, the OLED display device according to the present disclosure includes an OLED display panel 1, a gate driver 2, a data driver 3 and a timing controller 4.

On the OLED display panel 1, a plurality of gate lines GL and a plurality of data lines DL are disposed, and a plurality of subpixels P is arranged at intersections between the plurality of gate lines GL and the plurality of data lines DL in a matrix form. The plurality of subpixels P displays an image in accordance with image signals (i.e., data voltages) received from the plurality of data lines DL in response to scan pulses G received from the gate lines GL.

Each subpixel P includes an OLED composed of an anode, a cathode and an organic light emitting layer between the anode and the cathode, and a pixel circuit for independently driving the OLED.

The pixel circuit may include at least one switching TFT, a capacitor and a driving TFT.

The at least one switching TFT charges the capacitor with the data voltage in response to the scan pulse. The driving TFT controls the amount of current supplied to the OLED according to the data voltage charged in the capacitor to adjust the amount of light emitted from the OLED.

The OLED display panel 1 is defined by an active area AA for displaying an image to a user and a non-active area NA which is a peripheral area of the active area AA.

The gate driver 2 is a gate-in-panel (GIP) type gate driver and is disposed in the non-active area of the OLED display panel 1.

The gate driver 2 includes a gate shift register for sequentially supplying the scan pulse (gate driving signal) Vgout to each gate line GL according to a plurality of gate control signals GCS received from the timing controller 4.

The plurality of gate control signals GCS includes a plurality of clock signals CLKs having different phases, a gate start signal VST indicating driving start of the gate driver 2, a gate high voltage VGH, and a gate low voltage VGL.

The data driver 3 converts digital image data RGB received from the timing controller 4 into an analog data voltage using a reference gamma voltage and supplies the converted analog data voltage to the plurality of data lines DL. The data driver 3 is controlled according to a plurality of data control signals DCS received from the timing controller 4.

The timing controller 4 aligns the image data RGB received from the outside according to the size and resolution of the display panel 1 and supplies the image data to the data driver 3. In addition, the timing controller 4 generates a plurality of gate control signals GCS and a plurality of data control signals DCS using a synchronization signal SYNC received from the outside, such as a dot clock DCLK, a data enable signal DE, a horizontal synchronization signal Hsync and a vertical synchronization signal Vsync and respectively supplies the gate control signals and the data control signals to the gate driver 2 and the data driver 3.

The gate driver 2 includes a plurality of stages (GIPs) in order to sequentially supply the scan pulse (gate driving signal) Vgout to each of the plurality of gate lines GL.

In the present disclosure, one GIP includes one carry pulse output unit and at least one scan pulse output unit.

Figure 4:
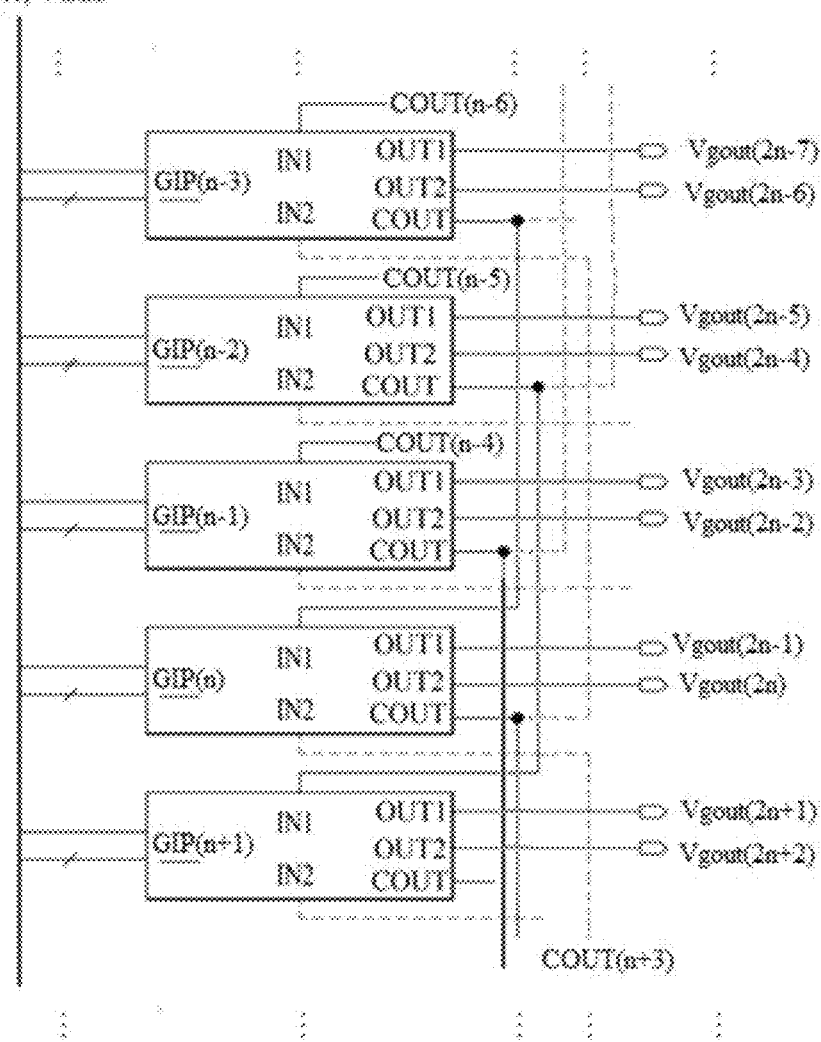
FIG. 4 is a block diagram showing the configuration of a gate driver according to the present disclosure.

FIG. 4 is a block diagram showing the configuration of a gate driver according to the present disclosure.

As shown in FIG. 4, the gate driver 2 according to the present disclosure includes a plurality of stages (GIPs) connected in cascade. Each stage (GIP) includes an output unit which is connected to at least one gate line GL. Each stage (GIP) receives the clock signals SCCLKs and CRCLKs, the gate start signal VST, the gate high voltage VGH and the gate low voltage VGL from the timing controller 4. Each stage (GIP) generates one carry pulse COUT(n) and at least one scan pulse Vgout(n) and Vgout (n+1).

In FIG. 4, each GIP outputs two scan pulses. However, the present disclosure is not limited thereto and the number of scan pulses output from each GIP may be $2^N$, N being a natural number. For example, the number of scan pulses output from each GIP may be 1, 2, 4, etc.

Figure 1:
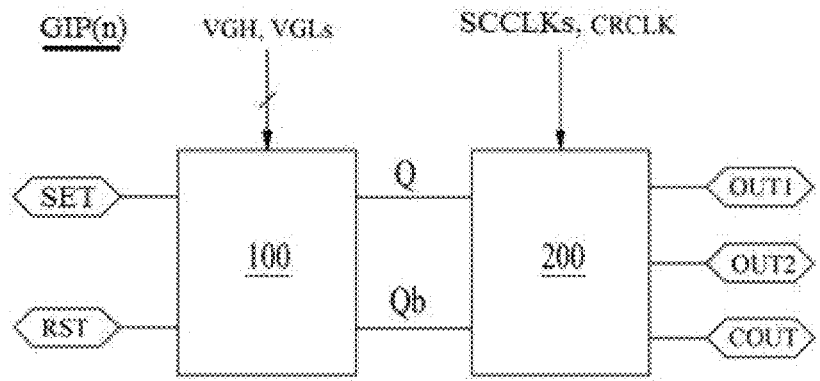
FIG. 1 is a block diagram showing the configuration of the conventional GIP.

Here, the configuration of each stage (GIP) was described with reference to FIGS. 1 and 2. However, the first and second bootstrap capacitors C1 and C2 formed in the first and second scan pulse output units 202 and 203 are not formed in each stage (GIP) but are disposed in the active area AA of the OLED display panel 1.

In the output unit 200 as shown in FIG. 2, in order for the first and second scan pulse output units 202 and 203 to supply a first scan pulse Vout(n) and a second scan pulse Vout(n+1) to corresponding gate lines, the output terminals of the first and second scan pulse output units 202 and 203 are connected to the corresponding gate lines disposed in the active area A/A of the OLED display panel 1.

As shown in FIG. 2, the first bootstrap capacitor C1 is connected between the gate electrode and source electrode of the second pull-up transistor Tp1 and the second bootstrap capacitor C2 is connected between the gate electrode and source electrode of the third pull-up transistor Tp2.

Specifically, the gate electrode of the second pull-up transistor Tp1 is connected to the first node Q and the source electrode of the second pull-up transistor Tp1 is connected to the corresponding gate line formed in the active area of the OLED display panel 1 through the output terminal of the first scan pulse output unit 202.

Similarly, the gate electrode of the third pull-up transistor Tp2 is connected to the first node Q and the source electrode of the third pull-up transistor Tp2 is connected to the corresponding gate line formed in the active area of the OLED display panel 1 through the output terminal of the second scan pulse output unit 203.

Accordingly, when the first node Q overlaps the corresponding gate line formed in the active area of the OLED display panel 1, the first and second bootstrap capacitors C1 and C2 of the GIP may be formed in the active area of the OLED display panel 1.

This will now be described in detail.

Figure 5A:
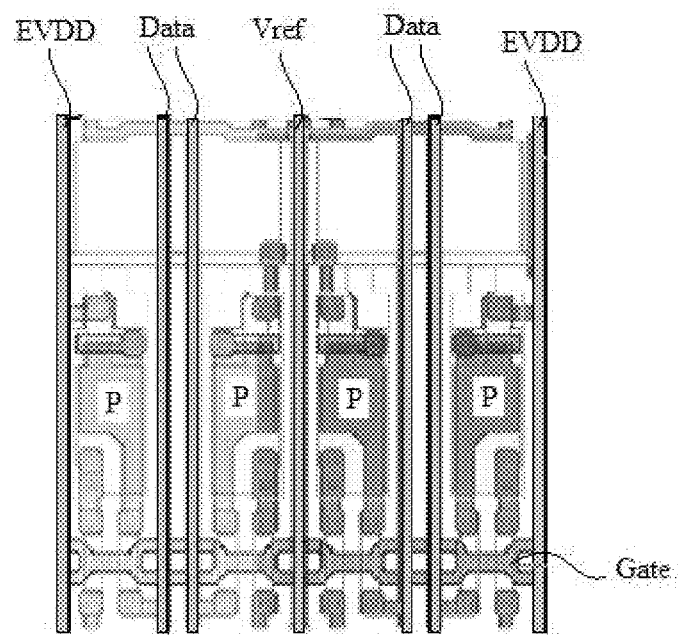
FIG. 5A is a diagram showing the layout of a conventional OLED display panel.
Figure 5B:
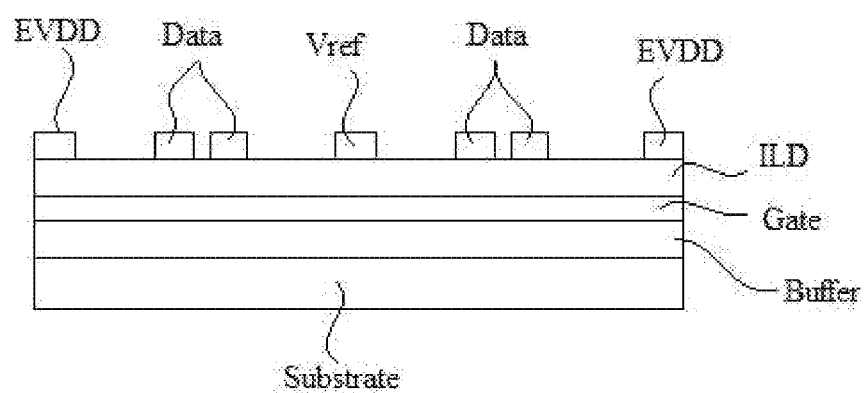
FIG. 5B is a schematic cross-sectional view of FIG. 5A in a gate line direction.

FIG. 5A is a diagram showing the layout of a conventional OLED display panel, and FIG. 5B is a schematic cross-sectional view of FIG. 5A in a gate line direction.

As shown in FIG. 5A, the conventional OLED display panel 1 includes a plurality of constant voltage supply lines EVDD and a plurality of data lines Data arranged in a vertical direction, a plurality of gate lines Gate arranged in a horizontal direction, and a plurality of subpixels P arranged in the pixel regions defined by the intersections of the gate lines and the data lines. In FIG. 5A, the subpixel has a 3T1C structure and a plurality of reference voltage supply lines Vref is further arranged in the vertical direction in parallel to the constant voltage supply lines EVDD and the data lines Data.

In the cross-sectional structure of the conventional OLED display panel 1, as shown in FIG. 5B, a buffer layer is formed on a substrate and the gate line Gate is formed on the buffer layer in the horizontal direction.

An interlayer insulating film ILD is formed on the entire surface of the buffer layer including the gate line Gate and the constant voltage supply line EVDD, the data line Data and the reference voltage supply line Vref are formed on the interlayer insulating film in the vertical direction.

The OLED display panel according to the present disclosure will now be described.

Figure 6A:
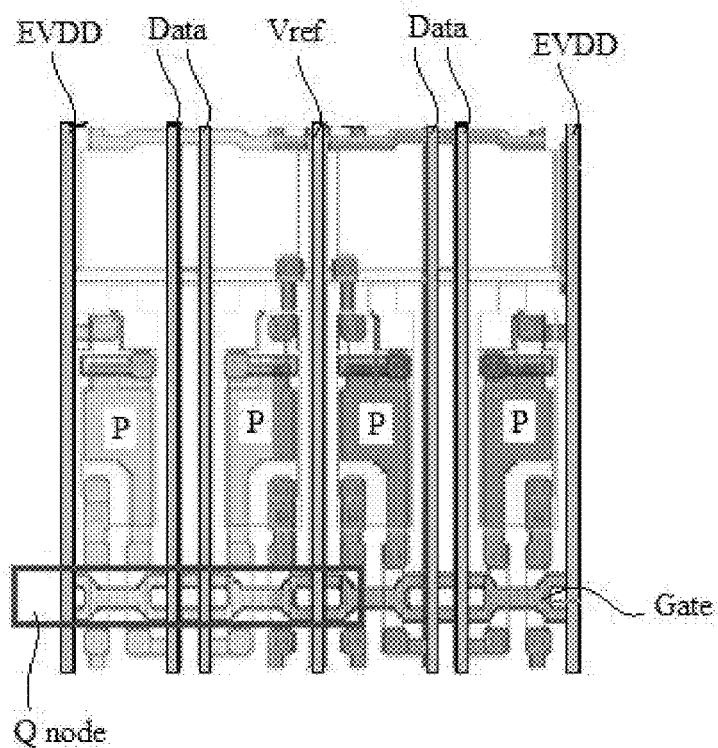
FIG. 6A is a diagram showing the layout of an OLED display panel according to the present disclosure.
Figure 6B:
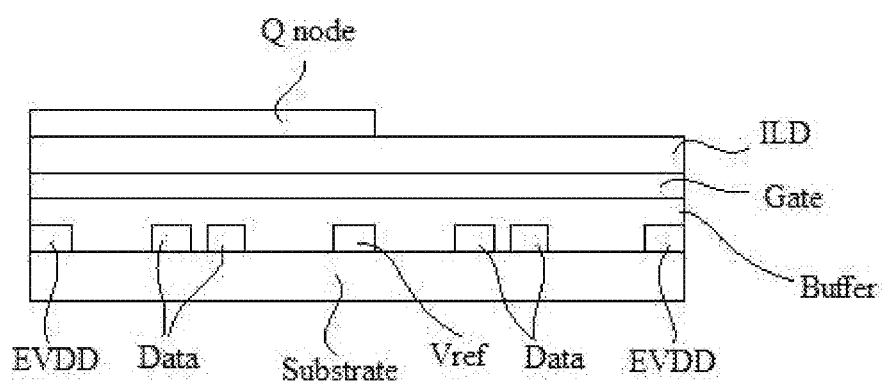
FIG. 6B is a schematic cross-sectional view of FIG. 6A in a gate line direction.

FIG. 6A is a diagram showing the layout of an OLED display panel according to the present disclosure, and FIG. 6B is a schematic cross-sectional view of FIG. 6A in a gate line direction.

As shown in FIG. 6A, the OLED display panel 1 according to the present disclosure includes a plurality of constant voltage supply lines EVDD and a plurality of data lines Data arranged in the vertical direction, a plurality of gate lines Gate arranged in the horizontal direction, and a plurality of subpixels P arranged in pixel regions defined by the intersections between the gate lines and the data lines. The first node (Q node) of the GIP is disposed on the gate line Gate of the OLED display panel 1 adjacent to the gate driver 2 to overlap the gate line with an interlayer insulating film interposed therebetween.

In FIG. 6A, the subpixel has a 3T1C structure and a plurality of reference voltage supply lines Vref is further arranged in the vertical direction in parallel to the constant voltage supply lines EVDD and the data lines Data.

Each subpixel P includes an OLED and a pixel circuit for independently driving the OLED. The pixel circuit may include at least one switching TFT, a capacitor and a driving TFT. That is, the pixel circuit may have various structures such as 2T1C, 3T1C, 4T1C, 4T2C, etc.

In the cross-sectional structure of the OLED display panel 1 according to the present disclosure, as shown in FIG. 6B, the constant voltage supply lines EVDD, the data lines Data and the reference voltage supply lines Vref are formed on a substrate Substrate in the vertical direction.

In addition, a buffer layer Buffer is formed on the entire surface of the substrate including the constant voltage supply lines EVDD, the data lines Data and the reference voltage supply lines Vref. The gate lines Gate are formed on the buffer layer in the horizontal direction.

An interlayer insulating film ILD is formed on the entire surface of the buffer layer including the gate lines Gate, and the first node (Q-node) of the GIP is formed on the interlayer insulating film ILD to overlap the gate line Gate.

The gate line Gate and the first node (Q-node) of the GIP overlap each other with the interlayer insulating film ILD interposed therebetween, thereby forming the bootstrap capacitor of the GIP.

In comparison between FIG. 5B and FIG. 6B, conventionally, the constant voltage supply lines EVDD, the data lines Data and the reference voltage supply lines Vref are formed above the gate lines Gate.

However, in the present disclosure, in order to form the bootstrap capacitors on the gate lines Gate, the constant voltage supply lines EVDD, the data lines Data and the reference voltage supply lines Vref are formed below the gate lines Gate, and the first node (Q-node) layers of the GIPs are formed above the gate lines Gate.

Accordingly, in the OLED display panel 1 of the LED display device according to the present disclosure, the constant voltage supply lines EVDD, the data lines Data and the reference voltage supply lines Vref are formed of the same material as a light shielding layer of the OLED display panel, and the first node Q is formed of the same material as the source/drain electrode of the switching TFT configuring the pixel circuit.

Although one bootstrap capacitor is shown in FIGS. 6A and 6B, when the first nodes (Q-nodes) are respectively formed to overlap the gate lines, to which the scan pulses are applied by the first and second scan pulse output units 202 and 203, the first and second bootstrap capacitors C1 and C2 of the first and second scan pulse output units 202 and 203 may be formed.

As described above, the gate driver 2 is disposed in the non-active area of the OLED display panel 1 in the gate-in-panel (GIP) type, and the first and second bootstrap capacitors C1 and C2 of the first and second scan pulse output units 202 and 203 are formed in the active area of the OLED display panel 1 adjacent to the gate driver 2.

Meanwhile, as another example, the first and second bootstrap capacitors C1 and C2 of the first and second scan pulse output units 202 and 203 may be formed over the active area of the OLED display panel 1 adjacent to the gate driver 2 and the output unit of each GIP.

Figure 7:
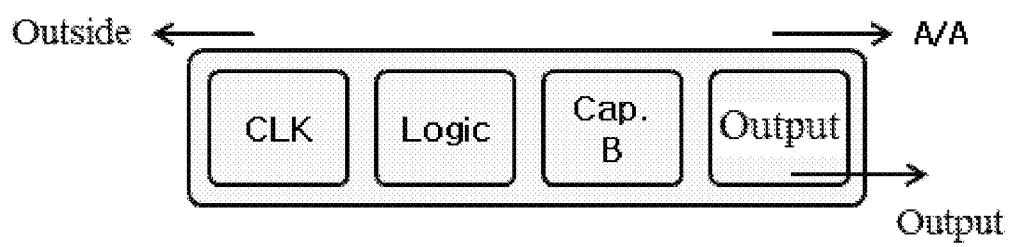
FIG. 7 is a block diagram showing the configuration of a conventional GIP in detail.
Figure 8:
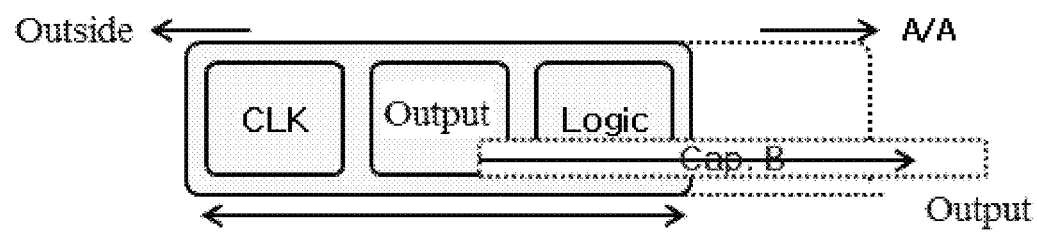
FIG. 8 is a block diagram showing the configuration of a GIP according to the present disclosure in detail.

FIG. 7 is a block diagram showing the configuration of a conventional GIP in detail, and FIG. 8 is a block diagram showing the configuration of a GIP according to the present disclosure in detail.

Since the gate driver 2 is disposed in the non-active area of the OLED display panel 1 in the GIP type, in the internal configuration of the conventional GIP, as shown in FIG. 7, a clock signal reception unit CLK for receiving the clock signals SCCLKs and CRCLKs from the timing controller 4, a node controller (Logic) 100 for controlling the voltages of the first and second nodes Q and Qb as described with reference to FIG. 1, and an output unit (Output) 200 for outputting the scan pulses Vgout(n) and Vgout(n+1) and the carry pulse COUT(n) according to the voltage levels of the first and second nodes Q and Qb are sequentially disposed from the outside to the active area A/A of the OLED display panel 1.

The first and second bootstrap capacitors (Cap. B) C1 and C2 of the first and second scan pulse output units 202 and 203 are disposed between the node controller (Logic) and the output unit (Output).

However, in the internal configuration of the GIP according to the present disclosure, as shown in FIG. 8, the clock signal reception unit CLK, the output unit (Output) and the node controller (Logic) are sequentially disposed from the outside to the active area A/A of the OLED display panel 1.

In the internal configuration of the GIP according to the present disclosure, as compared to the conventional configuration, the output unit Output is disposed at a position far from the active area of the OLED display panel 1 such that the output terminal of the output unit Output connected to the gate line of the OLED display panel 1 is formed long inside the GIP.

As described with reference to FIGS. 6A and 6B, when the gate line Gate overlaps the first node (Q-node) to form the bootstrap capacitor of the GIP in the active area of the OLED display panel 1, the first node (Q-node) of the GIP extends to the output terminal of the output unit (Output) formed long inside the GIP, thereby forming the bootstrap capacitor of the GIP.

When the bootstrap capacitor of the GIP is formed to extend to the output terminal of the output unit Output formed long inside the GIP, the overlap region between the gate line and the first node Q in the active area of the OLED display panel 1 may be reduced or the capacity of the bootstrap capacitor may be sufficiently secured.

As described above, in the OLED display device according to the present disclosure, the bootstrap capacitor of the GIP of the gate driver 2 is disposed in the active area of the OLED display panel 1, thereby reducing the bezel size.

FIG. 9 is a table showing comparison in bezel size between a conventional OLED display device and an OLED display device according to the present disclosure.

FIG. 9 shows comparison between the bezel sizes of the conventional OLED display device and the OLED display device according to the present disclosure in two models (13.3 FHD (166 ppi) and 55 UHD (80 ppi)).

As shown in FIG. 9, although the present disclosure increases the capacity of the bootstrap capacitor more than the conventional OLED display device, it is possible to reduce the bezel size as compared to the conventional OLED display device.

That is, in the 13.3 FHD (166 ppi) model, the present disclosure can reduce the bezel size by 0.9 mm as compared to the conventional OLED display device and, in the 55 UHD (80 ppi) model, the present disclosure can reduce the bezel size by 0.6 mm as compared to the conventional OLED display device.

The OLED display device according to the present disclosure having the above-described features has the following advantages.

Since the bootstrap capacitor of the GIP of the gate driver is disposed in the active area of the OLED display panel, the bezel size can be reduced.

Since the output terminal is formed long inside the GIP and the bootstrap capacitor of the GIP is formed to extend to the output terminal, it is possible to reduce the overlap region between the gate line and the first node Q in the active area of the OLED display panel 1 or to sufficiently secure the capacity of the bootstrap capacitor.

The present disclosure is not limited to the above-described aspects and the accompanying drawings. Those skilled in the art will appreciate that various substitutions, modifications and variations are possible without departing from the technical scope and spirit of the present disclosure.

What is claimed is:

1. An organic light emitting diode (OLED) display device comprising:
an OLED display panel where a non-active area and an active area are defined, having a plurality of gate lines and a plurality of data lines disposed in the active area, and having a plurality of pixels arranged at intersections between the plurality of gate lines and the plurality of data lines in a matrix form; and
a gate driver disposed in the non-active area and supplying a scan pulse to the plurality of gate lines, wherein the gate driver includes a plurality of gate-in-panels (GIPs) connected in cascade,
wherein each GIP includes one carry pulse output circuit, at least one scan pulse output circuit outputting a scan pulse to at least one of the plurality of the gate lines in accordance with voltages of a first node and a second node of the GIP and a bootstrap capacitor is disposed in the active area and formed by the first node vertically overlapping the plurality of gate lines.

2. The OLED display device according to claim 1, wherein the at least one scan pulse output circuit includes an output terminal electrically connected to the plurality of gate lines to supply the scan pulse to the at least one of the plurality of gate lines, and the first node is extended to the output terminal.

3. The OLED display device according to claim 1, wherein the each GIP further comprises;
a clock signal reception circuit receiving clock signals from a timing controller, and
a node controller controlling the voltages of the first node and the second node of the GIP,
wherein the clock signal reception circuit, the at least one scan pulse output circuit, and the node controller are sequentially disposed from outside to the active area.

4. The OLED display device according to claim 1, wherein the OLED display panel further comprises;
a plurality of constant voltage supply lines and a plurality of reference voltage supply lines arranged in parallel to the plurality of data lines,
a buffer layer disposed on an entire surface of the substrate including the plurality of data lines, the plurality of constant voltage supply lines and the plurality of reference voltage supply lines; and
an interlayer insulating layer disposed on an entire surface of the buffer layer including the plurality of gate lines,
wherein the plurality of gate lines are disposed on the buffer layer in a direction perpendicular to the plurality of data lines, and the first node is disposed on the interlayer insulating layer overlapping the plurality of gate lines.

5. The OLED display device according to claim 4, wherein the plurality of data lines, the plurality of constant voltage supply lines and the plurality of reference voltage supply lines are formed of a same material as a light shielding layer of the OLED display device, and
wherein the first node is formed of the same material as a source/drain electrode of a switching TFT of the OLED display panel.

6. The OLED display device according to claim 1, wherein the number of the scan pulse output from the GIP is $2^N$, where N is a natural number.

7. The OLED display device according to claim 1, wherein the bootstrap capacitor is extended to the output terminal of the at least one scan pulse output circuit.

8. An organic light emitting diode (OLED) display device comprising:
an OLED display panel where a non-active area and an active area are defined, having a plurality of gate lines and a plurality of data lines disposed in the active area, and having a plurality of pixels arranged at intersections between the plurality of gate lines and the plurality of data lines in a matrix form; and
a gate driver disposed in the non-active area and supplying a scan pulse to the plurality of gate lines, wherein the gate driver includes a plurality of gate-in-panels (GIPs) connected in cascade,
wherein each GIP includes at least one scan pulse output circuit outputting the scan pulse to at least one of the plurality of the gate lines in accordance with voltages of a first node and a second node of the GIP, and a bootstrap capacitor in the active area,
wherein the first node is extended to the active area and overlaps the plurality of gate lines to form the bootstrap capacitor.

9. The OLED display device according to claim 8, wherein each pixel includes an OLED and a pixel circuit for independently driving the OLED.

10. The OLED display device according to claim 9, wherein the pixel circuit is includes a 2T1C structure, a 3T1C structure, a 4T1C structure or a 4T2C structure.

11. A gate-in-panel (GIP) type organic light emitting diode (OLED) display panel, comprising:
a GIP gate driver including a clock signal reception circuit receiving clock signals from a timing controller, a node controller controlling voltage levels of a first node and a second node of the GIP, and an output circuit outputting at least one scan pulse output and a carry pulse output in accordance with the voltage levels of the first node and the second node; and a bootstrap capacitor of the output circuit disposed in an active area a display panel and formed by the first node vertically overlapping a plurality of gate lines and extended to a output terminal of the output circuit, wherein the bootstrap capacitor prevents output loss of the at least one scan pulse output of the gate driver, wherein the clock signal reception circuit is disposed at an outermost area of a non-active area of the display panel, the node controller is disposed away from the clock signal reception circuit toward a direction of an active area and the output circuit is disposed between the clock signal reception circuit and the node controller.

12. The OLED display device according to claim 11, wherein the output circuit includes an output terminal electrically connected to the gate line to supply the scan pulse to the at least one of the plurality of gate lines, and the first node is extended to the output terminal.

13. The OLED display device according to claim 11, further comprising:

a plurality of constant voltage supply lines and a plurality of reference voltage supply lines arranged in parallel to the plurality of data lines, a buffer layer disposed on an entire surface of the substrate including the plurality of data lines, the plurality of constant voltage supply lines and the plurality of reference voltage supply lines; and an interlayer insulating layer disposed on an entire surface of the buffer layer including the plurality of gate lines, wherein the plurality of gate lines are disposed on the buffer layer in a direction perpendicular to the plurality of data lines, and the first node is disposed on the interlayer insulating layer overlapping the plurality of gate lines.

14. The OLED display device according to claim 13, wherein the plurality of data lines, the plurality of constant voltage supply lines and the plurality of reference voltage supply lines are formed of a same material as a light shielding layer of the OLED display device, and wherein the first node is formed of the same material as a source/drain electrode of a switching TFT of the OLED display panel.

15. The OLED display device according to claim 11, wherein the number of at least one scan pulse output from the GIP is $2^N$, where N is a natural number.

16. The OLED display device according to claim 11, wherein the bootstrap capacitor is extended to the output terminal of the output circuit.

* * * * *